(12) United States Patent
Hue et al.

(10) Patent No.: US 10,254,545 B2
(45) Date of Patent: Apr. 9, 2019

(54) DATA-DISPLAY GLASSES COMPRISING AN ANTI-GLARE SCREEN

(71) Applicant: Valeo Vision, Bobigny (FR)

(72) Inventors: David Hue, Butry sur Oise (FR); Benoist Fleury, Vincennes (FR)

(73) Assignee: Valeo Vision, Bobigny (FR)

( * ) Notice: Subject to any disclaimer, the term of this patent is extended or adjusted under 35 U.S.C. 154(b) by 250 days.

(21) Appl. No.: 14/916,301

(22) PCT Filed: Sep. 23, 2014

(86) PCT No.: PCT/EP2014/070263
§ 371 (c)(1),
(2) Date: Mar. 3, 2016

(87) PCT Pub. No.: WO2015/044143
PCT Pub. Date: Apr. 2, 2015

(65) Prior Publication Data
US 2016/0216514 A1    Jul. 28, 2016

(30) Foreign Application Priority Data

Sep. 26, 2013 (FR) ..................... 13 59271

(51) Int. Cl.
*G02B 27/01* (2006.01)
*G02B 26/02* (2006.01)
(Continued)

(52) U.S. Cl.
CPC ............ *G02B 27/0172* (2013.01); *B81B 7/02* (2013.01); *G02B 26/02* (2013.01); *G02B 27/017* (2013.01);
(Continued)

(58) Field of Classification Search
CPC .. G02B 27/01; G02B 27/017; G02B 27/0172; G02B 2027/0118; G02B 2027/0178;
(Continued)

(56) References Cited

U.S. PATENT DOCUMENTS

| 3,199,114 A | 8/1965 | Malifaud |
| 3,961,181 A | 6/1976 | Golden |

(Continued)

FOREIGN PATENT DOCUMENTS

| CN | 301804989 | 1/2012 |
| CN | 102707456 A | 10/2012 |

(Continued)

*Primary Examiner* — William R Alexander
*Assistant Examiner* — Ephrem Z Mebrahtu
(74) *Attorney, Agent, or Firm* — Oblon, McClelland, Maier & Neustadt, L.L.P.

(57) ABSTRACT

A pair of spectacles equipped with at least one lens and intended to be worn by a user, the spectacles comprising displaying means allowing the data to be projected into a field of view of the user, and an anti-glare screen provided with a variable transmission coefficient allowing the intensity of incident light intended to pass through the lens toward the user to be attenuated, the displaying means and the anti-glare screen being positioned so that some of the rays emitted by the displaying means, in order to display the data, strike the anti-glare screen, the spectacles being configured to adapt the transmission coefficient of the anti-glare screen depending on the intensity of the incident light, the displaying means furthermore being coupled to the anti-glare screen so that the displaying means display data when the anti-glare screen transmits the light.

20 Claims, 2 Drawing Sheets

Figure 1:
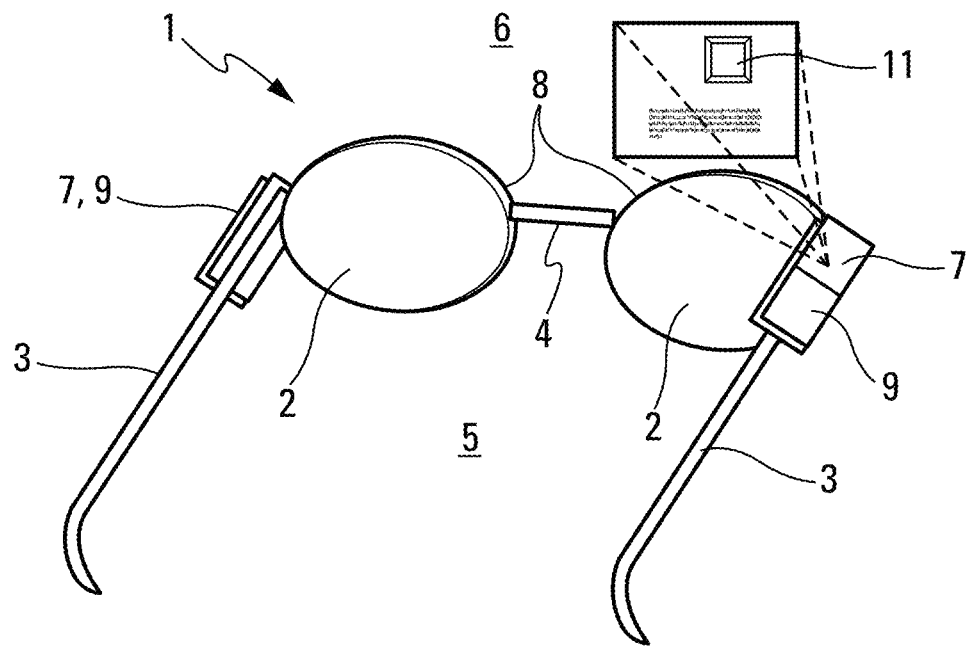

(51) Int. Cl.
*B81B 7/02* (2006.01)
*G02C 11/00* (2006.01)

(52) U.S. Cl.
CPC ........ *G02C 11/10* (2013.01); *B81B 2201/047* (2013.01); *G02B 2027/0118* (2013.01); *G02B 2027/0178* (2013.01)

(58) Field of Classification Search
CPC .......... G02C 7/10; G02C 7/101; G02C 7/102; G02C 7/104; B81B 7/02
See application file for complete search history.

(56) References Cited

U.S. PATENT DOCUMENTS

| | | | |
|---|---|---|---|
| 4,286,308 A | 8/1981 | Wolff | |
| 4,311,368 A | 1/1982 | Saito et al. | |
| 4,848,890 A | 7/1989 | Horn | |
| 5,258,607 A | 11/1993 | Agostini et al. | |
| 5,276,539 A | 1/1994 | Humphrey | |
| 5,486,938 A | 1/1996 | Aigrain | |
| 5,671,035 A | 9/1997 | Barnes | |
| 5,835,458 A | 11/1998 | Bischel et al. | |
| 5,859,735 A | 1/1999 | De Vries | |
| 5,911,018 A | 6/1999 | Bischel et al. | |
| 5,978,524 A | 11/1999 | Bischel et al. | |
| 6,078,704 A | 6/2000 | Bischel et al. | |
| 6,118,908 A | 9/2000 | Bischel et al. | |
| 6,133,686 A | 10/2000 | Inoue et al. | |
| 6,141,465 A | 10/2000 | Bischel et al. | |
| 6,313,587 B1 | 11/2001 | MacLennan et al. | |
| 6,384,982 B1 | 5/2002 | Spitzer | |
| 6,424,448 B1 | 7/2002 | Levy | |
| 6,456,438 B1* | 9/2002 | Lee | G02B 27/01 359/630 |
| 6,493,128 B1 | 12/2002 | Agrawal et al. | |
| 6,522,794 B1 | 2/2003 | Bischel et al. | |
| 6,557,995 B1 | 5/2003 | Edwards | |
| 6,568,738 B1 | 5/2003 | Braun | |
| 6,624,564 B2 | 9/2003 | Wang et al. | |
| 6,626,532 B1 | 9/2003 | Nishioka et al. | |
| 6,928,180 B2 | 8/2005 | Stam et al. | |
| 7,134,707 B2 | 11/2006 | Isaac | |
| 7,684,105 B2 | 3/2010 | Lamontagne et al. | |
| 7,751,122 B2 | 7/2010 | Amitai | |
| 7,874,666 B2 | 1/2011 | Xu et al. | |
| 7,893,890 B2 | 2/2011 | Kelly et al. | |
| 7,970,172 B1 | 6/2011 | Hendrickson | |
| 8,197,931 B2 | 6/2012 | Ueda et al. | |
| 8,208,504 B2 | 6/2012 | Dantus et al. | |
| 8,233,102 B2 | 7/2012 | Burlingame et al. | |
| D665,009 S | 8/2012 | Nibauer et al. | |
| D717,865 S | 11/2014 | Votel et al. | |
| 8,964,298 B2 | 2/2015 | Haddick et al. | |
| 8,976,084 B2 | 3/2015 | Hamdani et al. | |
| D734,808 S | 7/2015 | Markovitz et al. | |
| 9,087,471 B2 | 7/2015 | Miao | |
| D735,799 S | 8/2015 | Markovitz et al. | |
| 9,186,963 B2 | 11/2015 | Tewari et al. | |
| D746,362 S | 12/2015 | Markovitz et al. | |
| D747,403 S | 1/2016 | Markovitz et al. | |
| 9,277,159 B2 | 3/2016 | Shin et al. | |
| D763,944 S | 8/2016 | Shin | |
| D765,761 S | 9/2016 | Votel et al. | |
| D769,358 S | 10/2016 | Markovitz et al. | |
| D769,362 S | 10/2016 | Markovitz et al. | |
| D769,962 S | 10/2016 | Markovitz et al. | |
| 9,511,650 B2 | 12/2016 | Momot | |
| 10,108,012 B2* | 10/2018 | Mills | G02B 27/0172 |
| 2002/0175615 A1 | 11/2002 | Wang et al. | |
| 2006/0140502 A1 | 6/2006 | Tseng et al. | |
| 2006/0175859 A1 | 8/2006 | Isaac | |
| 2007/0285759 A1 | 12/2007 | Ash et al. | |
| 2008/0048932 A1* | 2/2008 | Yanagisawa | G01C 21/36 345/9 |
| 2008/0186604 A1 | 8/2008 | Amitai | |
| 2008/0218434 A1 | 9/2008 | Kelly et al. | |
| 2009/0213282 A1* | 8/2009 | Burlingame | G02C 7/101 349/13 |
| 2009/0213283 A1 | 8/2009 | Burlingame et al. | |
| 2010/0065721 A1 | 3/2010 | Broude et al. | |
| 2010/0161177 A1 | 6/2010 | Yuter | |
| 2010/0194857 A1 | 8/2010 | Mentz et al. | |
| 2011/0072961 A1 | 3/2011 | Jungkuist et al. | |
| 2011/0233384 A1 | 9/2011 | Wu et al. | |
| 2011/0288725 A1 | 11/2011 | Yuter | |
| 2012/0019891 A1 | 1/2012 | Dewell | |
| 2012/0026071 A1 | 2/2012 | Hamdani et al. | |
| 2012/0044560 A9 | 2/2012 | Lam et al. | |
| 2012/0126099 A1 | 5/2012 | Tewari et al. | |
| 2012/0180204 A1 | 7/2012 | Hawkins | |
| 2012/0303214 A1 | 11/2012 | Yuter | |
| 2013/0113973 A1 | 5/2013 | Miao | |
| 2013/0127980 A1 | 5/2013 | Haddick et al. | |
| 2013/0300911 A1 | 11/2013 | Beckman | |
| 2014/0109302 A1 | 4/2014 | Casbi et al. | |
| 2014/0152711 A1* | 6/2014 | Sekiya | G02B 27/01 345/690 |
| 2014/0153076 A1 | 6/2014 | Tewari et al. | |
| 2014/0253816 A1 | 9/2014 | Shin et al. | |
| 2015/0062469 A1 | 3/2015 | Fleury | |
| 2015/0077826 A1 | 3/2015 | Beckman | |
| 2015/0362728 A1* | 12/2015 | Tei | G02B 5/3033 353/20 |
| 2016/0077400 A1 | 3/2016 | Lam et al. | |
| 2016/0214467 A1 | 7/2016 | El Idrissi et al. | |
| 2016/0216536 A1 | 7/2016 | Hue et al. | |
| 2016/0223816 A1 | 8/2016 | Hue et al. | |
| 2016/0357014 A1 | 12/2016 | Beckman | |
| 2017/0023802 A1 | 1/2017 | El Idrissi et al. | |

FOREIGN PATENT DOCUMENTS

| | | |
|---|---|---|
| DE | 2001086 A1 | 7/1971 |
| DE | 3836095 A1 | 4/1990 |
| DE | 102012008913 A1 | 11/2012 |
| EP | 0341519 A2 | 11/1989 |
| EP | 0459433 A1 | 12/1991 |
| EP | 0498143 A1 | 8/1992 |
| EP | 0945303 A1 | 9/1999 |
| FR | 2684770 A1 | 6/1993 |
| FR | 2693562 A1 | 1/1994 |
| FR | 2722581 A1 | 1/1996 |
| FR | 2781289 A1 | 1/2000 |
| FR | 2846756 A1 | 5/2004 |
| FR | 2941786 A1 | 8/2010 |
| FR | 2975792 A1 | 11/2012 |
| FR | 2976089 A1 | 12/2012 |
| FR | 2988493 A1 | 9/2013 |
| FR | 3010941 A1 | 3/2015 |
| FR | 3011091 A1 | 3/2015 |
| GB | 2420183 A | 5/2006 |
| GB | 2445365 A | 7/2008 |
| JP | 2004233908 A | 8/2004 |
| WO | 9210130 A1 | 6/1992 |
| WO | 9214625 A1 | 9/1992 |
| WO | 9512502 A1 | 5/1995 |
| WO | 9620846 A1 | 7/1996 |
| WO | 9827452 A1 | 6/1998 |
| WO | 2012036638 A1 | 3/2012 |
| WO | WO2012115301 A1 | 8/2012 |

* cited by examiner

DATA-DISPLAY GLASSES COMPRISING AN ANTI-GLARE SCREEN

CROSS-REFERENCE TO RELATED APPLICATIONS

This application is the U.S. National Phase application of PCT Application No. PCT/EP2014/070263 filed Sep. 23, 2014, which claims priority to the French application 1359271 filed on Sep. 26, 2013, which applications are incorporated herein by reference and made a part hereof.

BACKGROUND OF THE INVENTION

1. Field of the Invention

The present invention relates to data-displaying spectacles equipped with an anti-glare screen.

2. Description of the Related Art

In the field of portable optical devices equipped with technologies related to the field of communicating data and informing, data-displaying spectacles capable of displaying data or information that may be seen by the user wearing them are known. The information is superposed, transparently or not, on the scene that the user would normally observe through the spectacles.

Such a displaying device is an optronic device allowing a user to view information, such as text, images or video, in his field of view, without needing to turn or lower his head. Thus, the user may move around and observe his environment while simultaneously having access to information.

This information may relate directly to objects and places visible through the spectacles; the image may even be made interactive, for example by adding light signals relating to the observed scene. The information may also be independent of the momentary vision of the user, and for example provide access to the Internet and/or to an electronic message, which the user may consult while retaining a view allowing him to move or act freely.

Spectacles equipped with different display technologies exist.

Patent application FR 2 976 089 describes a pair of spectacles including one or two projectors placed on the temples. The projectors project an image in front of the wearer of the spectacles, the wearer needing a medium in front of him to perceive them. As is described in patent application FR 2 941 786, which is equivalent to U.S. Pat. No. 8,976,084 and U.S. Patent Publication No. 2012/0026071, the lenses of the spectacles may serve as the medium, especially if spectacles providing an augmented reality function are envisioned.

More sophisticated displaying systems allow the images to be displayed using lenses equipped with faces guiding the light in the lens, a formed image being visible to the user, such as is disclosed in U.S. Pat. No. 7,751,122.

However, the difficulty with current systems relates to the visibility of the information when luminosity is high. Specifically, under these conditions, the contrast of the information makes it hard or impossible to see if the intensity of the information is not high enough relative to incident light of high intensity. In addition, when a user moves, regular and rapid changes in luminosity occur.

Furthermore, for a pair of spectacles equipped with sunglass lenses, these lenses decrease the visibility of the information, especially if it is in color. In addition, sunglass lenses are not compatible with all data-displaying technologies.

The objective of the invention is to remedy these drawbacks, and aims to provide a pair of data-displaying spectacles usable in and adaptable to any situation, whatever the ambient light intensity.

SUMMARY OF THE INVENTION

To this end, the spectacles, which are equipped with at least one lens and intended to be worn by a user, comprise displaying means allowing the data to be projected into a field of view of the user, and an anti-glare screen provided with a variable transmission coefficient allowing the intensity of incident light intended to pass through the lens toward the user to be attenuated, the displaying means and the anti-glare screen being positioned so that some of the rays emitted by the displaying means, in order to display the data, strike the anti-glare screen, the spectacles being configured to adapt the transmission coefficient of the anti-glare screen depending on the intensity of the incident light, the displaying means furthermore being coupled to the anti-glare screen so that the displaying means display data when the anti-glare screen transmits the light.

Thus, the spectacles allow, using a given medium incorporating all the necessary functions, data displayed on the display zone to be read despite a high luminosity. Furthermore, whatever the luminosity of the incident light, the spectacles allow the transmission coefficient of the screen to be adapted so that the wearer of the spectacles perceives a luminosity of moderate intensity whatever the situation.

In addition, as the anti-glare screen transmits the light when the displaying means are displaying data, light coming from the data displayed on the display zone and that is directed towards the anti-glare screen passes through the anti-glare screen. This feature prevents this light from being reflected from the anti-glare screen and, therefore, ghosting impeding the data from being correctly perceived and easily read.

The transmission coefficient of the anti-glare screen and/or of the displaying means will possibly be controlled either using control means integrated into the spectacles or located remotely. Likewise, the information relating to the luminosity will possibly originate from a sensor located on the spectacles and/or remotely.

According to various embodiments of the invention, which will possibly be employed together or separately:
- the coupling is produced by controlling the light intensity of the displayed data depending on the transmission coefficient of the anti-glare screen, the light intensity of the displayed data being modified inversely proportionally to the transmission coefficient, in order to obtain a similar perception of the data by the user whatever the amount of incident light;
- the transmission coefficient is determined by pulse width modulation with a set duty cycle;
- the light intensity of the displayed data is determined by pulse width modulation with a set duty cycle;
- the light intensity and the transmission coefficient are in phase and have the same duty cycle;
- the modulation is carried out with a fixed frequency and with a variable duty cycle;
- the spectacles comprise means for controlling the duty cycle or duty cycles;
- the anti-glare screen is borne by the lens;
- the anti-glare screen is placed on a second side of the lens, the incident light being intended to pass through the lens from the second side of the lens to a first side;

the anti-glare screen is provided with a microelectromechanical layer which is placed on the lens;

the microelectromechanical layer is activatable to block or transmit the light;

the displaying means comprise a transmitting substrate so as to guide light rays by internal reflection in the lens;

the means for displaying data comprise a light source able to emit the light rays into the lens; and the means for displaying data comprise an image generator.

These and other objects and advantages of the invention will be apparent from the following description, the accompanying drawings and the appended claims.

BRIEF DESCRIPTION OF THE ACCOMPANYING DRAWINGS

Figure 2:
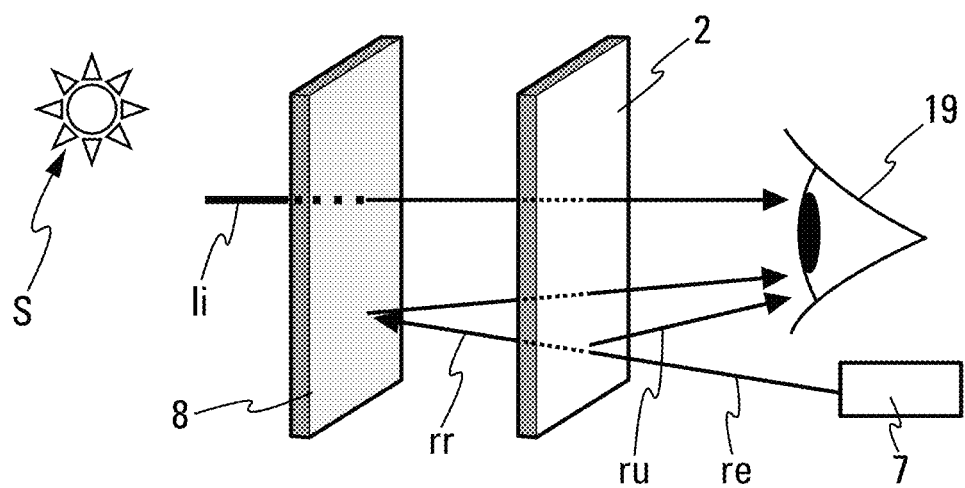
Figure 3:
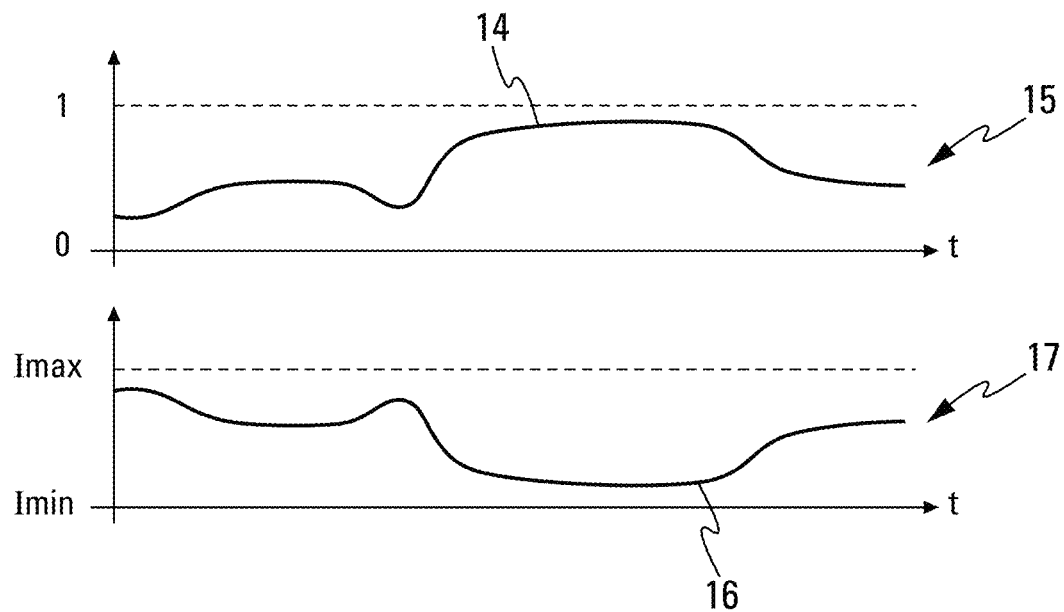
Figure 4:
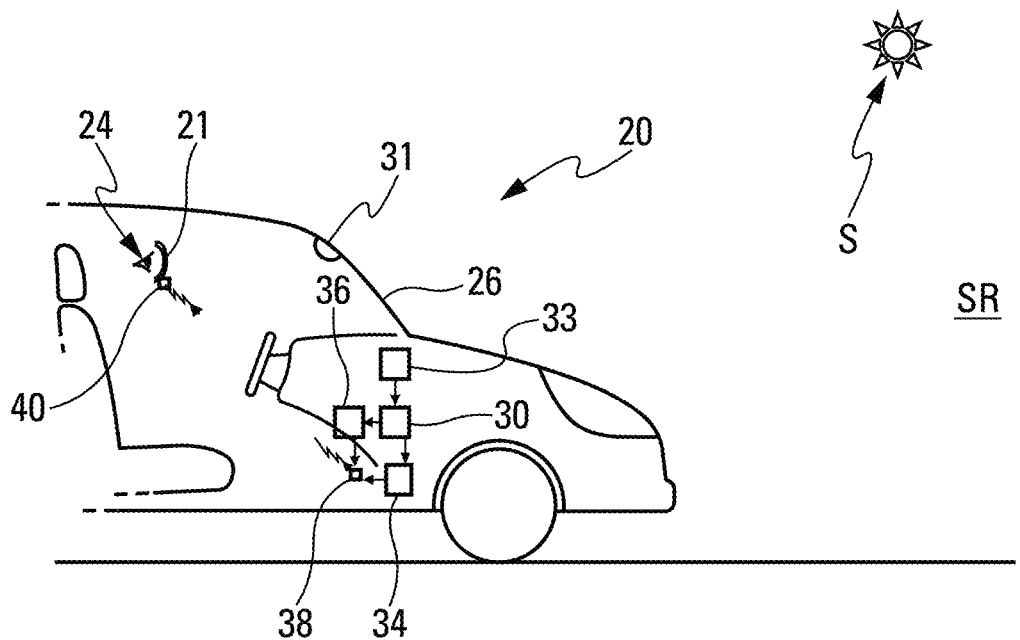

The invention will be better understood in light of the following description, which is given merely by way of indication and not intended to be limiting, accompanied by the appended drawings, in which:

FIG. 1 schematically illustrates a perspective view of a pair of data-displaying spectacles according to the invention;

FIG. 2 schematically illustrates the operating principle of one embodiment of the spectacles according to the invention;

FIG. 3 shows a graph showing the light transmission of the anti-glare screen compared to a graph showing the intensity of the displayed data; and FIG. 4 schematically illustrates a partial cross-sectional view of a vehicle in which the spectacles are used.

DETAILED DESCRIPTION OF THE PREFERRED EMBODIMENTS

As illustrated in FIGS. 1 and 2, the spectacles 1 according to the invention have two lenses 2, two temples 3 and a frame 4 in which the lenses 2 are fixed. In the description of the invention, the term lens designates the object fixed in the frame 4 and through which the wearer of the spectacles looks at the scene that is in front of him. The lenses 2 may be manufactured from a mineral or organic glass material for example, but also from any other material known to those skilled in the art to this end.

The wearer of the spectacles 1 is located on a first side of the lenses 2, and the scene that he observes is located on a second side of the lenses 2. Thus, the incident light li striking the lenses 2 originates from the second side, then passes through the lenses 2 via the exterior face of the lenses 2, and exits via the interior face toward the wearer of the spectacles 1.

The spectacles 1 comprise displaying means 7 for displaying data in the direction of a field of view of the user. The displaying means 7 are configured to emit rays re allowing data to be displayed.

The image containing the data advantageously forms on a virtual medium, placed a few meters away or at infinity so as to have a sufficient size to display the data.

The displaying means 7 for displaying data are configured to transmit the rays re using the lens 2. The displaying means 7 then comprise, for example, a light source, for instance an image generator, able to emit into the lens 2, and a transmitting substrate so as to guide the rays re by internal reflection in the lens 2.

The spectacles 1 furthermore include an anti-glare screen 8. The displaying means 7 and the anti-glare screen 8 are positioned, relative to each other, so that the rays re emitted by the displaying means 7, in order to display the data, strike the anti-glare screen 8. For example, the anti-glare screen 8 is placed on the second side of the lens 2, for example on the exterior face of the lenses 2, on the other side to the user relative to the spectacles 1.

To decrease dazzle, the anti-glare screen 8 is provided with a variable transmission coefficient 14 allowing the intensity of the incident light li to be attenuated. Depending on the value of the transmission coefficient 14, the anti-glare screen 8 allows more or less of the incident light li to pass through.

The transmission coefficient 14 is determined by pulse width modulation. The modulation is carried out at fixed frequency, preferably at at least 100 Hz, with a duty cycle α defining the transmission coefficient 14 of the anti-glare screen 8.

The anti-glare screen 8 therefore has a light transmission coefficient 14 that varies periodically between:

a maximum value, for which transparency is maximum during a time t1; and a minimum value, for which the transparency is minimum during a time t2.

A duty cycle α is determined by the ratio of the duration t1 during which the transmission is maximum to the duration T of the period, and therefore varies from 0 to 100%:

$$\alpha = \frac{t_1}{T}$$

By modifying the duty cycle α, the time t1 during which the transparency is maximum is lengthened or shortened, relative to the time t2 during which light does not pass. Thus, by increasing t1, the duty cycle α increases, and by increasing t2, the duty cycle α decreases. The average value of the transmission coefficient 14 is thus dependent on the value of the duty cycle α.

The scene located in front of the wearer of the spectacles 1 is therefore visible only during a fraction of time equal to the duty cycle α. The luminosity seen through the variable-transmission anti-glare screen 8 is therefore decreased relative to the actual luminosity by a factor equal to (1−α).

Furthermore, the spectacles 1 are configured to adapt the transmission coefficient 14 of the anti-glare screen 8 depending on the intensity of the incident light li. The spectacles 1 thus allow, in addition to displaying data for the user, him to be protected from high luminosities. Therefore, the user can read the displayed data even if luminosity levels are high. Thus, the coupling of a pair of data-displaying spectacles 1 and an anti-glare system allows a satisfactory contrast to be preserved for the displayed information, independently of the light level or glare level of the scene in front of which the wearer of the spectacles 1 finds himself.

To this end, the spectacles 1 comprise means 9 for controlling the transmission coefficient 14, which either control the instantaneous value or average value of the transmission coefficient 14. For example, by choosing a given duty cycle, a corresponding transmission coefficient 14 is defined.

Thus, the duty cycle α is variable and chosen depending on the light intensity of the incident light li. In order to measure the light intensity of the incident light li, the spectacles 1 will possibly comprise a luminosity sensor (not shown) that delivers the measurement to the controlling means 9. The controlling means 9 set the value of the duty cycle α depending on this measurement.

In a first embodiment, the anti-glare screen 8 is equipped with a vertical polarization layer and a horizontal polarization layer, which are placed on the lens 2, and a liquid-crystal layer that is arranged between the two polarization layers. The polarization layers each polarize the incident light li in a different direction. In the liquid-crystal layer, the direction of the polarized light is modified by the liquid crystals. The orientation of the liquid crystals determines the polarization direction of the light. Thus, when they are oriented in a way that modifies the polarization to the same direction as that of the following polarization layer, the light passes through. In contrast, if the direction is different, the light is not transmitted to the wearer of the spectacles 1.

The modulation is carried out by orienting the liquid crystals in the same direction as that of the following polarization layer during the time t1, in order to transmit the light, then by orienting it in a different direction during the time t2, in order to block the light.

In a second embodiment, the anti-glare screen 8 is equipped with a MEMS-type microelectromechanical layer (MEMS standing for microelectromechanical system) placed on the lens 2. This layer is composed of electrically actuatable microelectronic elements that block or let pass the incident light li. The microelectromechanical systems are for example of the type described in U.S. Pat. No. 7,684,105. Here, the modulation is carried out by letting pass the incident light li during the time t1, and by blocking it during the time t2, by actuation of the microelectromechanical layer.

It may be seen in FIG. 2 that the incident light li first passes through the anti-glare screen 8 then through the lens 2 to arrive at the eye 19 of the user. The transmission coefficient 14 of the anti-glare screen 8 allows the intensity of the incident light li to be decreased for the comfort of the user. Simultaneously, the displaying means 7 project rays re, which encounter the lens 2 first. The display of the data on the lens 2 emits rays ru toward the user, allowing him to perceive the data. Other rays rr are transmitted in the direction of the anti-glare screen 8, and are at least partially reflected toward the eye 19 of the user through the lens 2. Therefore, a second image of the data is liable to be displayed on the lens 2, shifted relative to the normal image.

To prevent this reflection, the displaying means 7 and the anti-glare screen 8 are coupled so that the displaying means 7 display data when the anti-glare screen 8 transmits the light, i.e. during the time t1 of the duty cycle α. Thus, when the anti-glare screen 8 does not transmit light during the time t2 of the duty cycle α, the displaying means 7 do not display data, in order to limit reflection from the anti-glare screen 8, which does not transmit the light during the time t2.

According to one particular embodiment, the light intensity 16 of the displayed data is also set by pulse width modulation with a variable duty cycle and a fixed frequency. The data appear only during the time t1 at a given reference intensity, the displaying means 7 not displaying data in the display zone 11 during the time t2. The intensity of the data is controlled by varying the coefficient α, thereby increasing or decreasing the display time t1 relative to a constant-period duration T. In this case, the controlling means 9 also control the duty cycle α of the light intensity 16 of the data.

To correlate the light intensity 16 of the data and the transmission coefficient 14, the light intensity 16 and the transmission coefficient 14 are in phase with an identical ratio α. Thus, the data are displayed when the anti-glare screen 8 lets the light pass, and are not if the anti-glare screen 8 is opaque. Nevertheless, the reference intensity will possibly be adapted to retain a similar perceived intensity whatever the ratio α. Thus, if the time t1 increases because of a low luminosity, the reference intensity is decreased proportionally. Identically, if the time t1 decreases because of a high luminosity, the reference intensity is increased proportionally.

As a variant, the display intensity of the displaying means 7 will possibly be correlated to the value of the transmission coefficient 14 of the anti-glare screen 8 with the aim of keeping constant the amount of light originating from the displayed data, and that reach the eye 19 of the wearer of the spectacles 1. To this end, the light intensity 16 of the displayed data is modified inversely proportionally to the transmission coefficient 14, in order to obtain a similar perception of the data by the user, whatever the amount of incident light li, as is shown in FIG. 3, in which two graphs 15, 17 are superposed. In the graph 15, the transmission coefficient 14 varies between 0 and 1 in the time t. In the graph 17, the light intensity 16 varies between a minimum value Imin and a maximum value Imax in the time t. When the transmission of the anti-glare screen 8 increases, the light intensity 16 of the data decreases proportionally, and reciprocally.

In other words, the spectacles 1 simultaneously allow the transmission coefficient 14 of the anti-glare screen 8 to be adapted depending on the intensity of the incident light li so that the wearer of the spectacles 1 is not dazzled, and the light intensity 16 of the data displayed in the display zone to be adapted depending on the transmission coefficient 14 of the anti-glare screen 8, in order for the data to be perceivable in a similar way whatever the situation.

In a specific application described below, the spectacles 1 are used as a device for assisting with driving an automotive vehicle 20. This application is described by way of example, but does not limit the application of the spectacles 1 of the invention to this example.

FIG. 4 shows this device for assisting with driving using adaptive spectacles 21 according to the invention, though this application must not be considered to be limiting.

It may be seen that when it is sunny, especially at the end of the day when the height of the sun S above the horizon is low, the road scene SR in front of the vehicle 20 is brightly illuminated. The driver 24 therefore runs the risk not only of being dazzled, but also of not being able to distinguish details in this road scene SR that are important for his safety, for example road signs warning of a nearby source of danger, or the state of the road surface over which he is driving. The same goes for nighttime driving, during which the driver 24 may be dazzled by the lights of other vehicles.

The adaptive spectacles 21 then serve to protect the driver 24 or passengers who are wearing them against any form of dazzle or substantial variation in the incident light li intensity. However, the driver 24 must for example be able to visually access driving-related information such as that conventionally displayed on the dashboard, and which are not accessible if the average value of the transmission coefficient 14 is low. By virtue of the invention, this information is displayed directly on the adaptive spectacles 21, with a light intensity 16 determined so that it is visible by the wearer of the adaptive spectacles 21.

The invention therefore makes provision in this application for the driver 24 to be equipped with a pair of adaptive spectacles 21 in order to modulate the amount of light reaching the eye 19 of the driver 24, while simultaneously presenting him with information. A single spectacle lens 2 has been shown for the sake of clarity of the drawing.

Furthermore, this device comprises means 30 or a controller for controlling the transmission coefficient 14, which are here located remotely from the adaptive spectacles 21. The controlling means 30 are for example arranged in the passenger compartment of the vehicle 20, and communicate control commands to the adaptive spectacles 21.

To control the transmission coefficient 14 of the lenses 2 of the adaptive spectacles 21, the invention makes provision for a photosensitive sensor 31 to be used to measure the luminosity of the road scene SR in front of the vehicle 20.

The photosensitive sensor 31 is here located, for example, on the interior face of the windshield 26 of the vehicle 20, level with the interior rear-view mirror (not shown), i.e. in the middle of the upper portion of the windshield 26. This position makes it possible to gather information that is particularly representative of the luminosity outside the vehicle 20, issued from the road scene SR.

The output signal SL from the photosensitive sensor 31 is received and processed by a circuit 33 able to convert the output signal SL into a control signal SC for controlling the transmission coefficient 14 of the lenses 2 of the adaptive spectacles 21, the control signal SC being in turn received by the means 30 for controlling the transmission coefficient 14 of the lenses 2 of the adaptive spectacles 21.

The controlling means 30 control a circuit 34 for controlling the transmission coefficient 14 of the lenses 2 of the adaptive spectacles 21, which itself comprises an emitter 38, for example of ultrasonic, infrared or radio waves, implementing a wireless communication protocol, for example meeting the Bluetooth or Wi-Fi (registered trademarks) standards. The adaptive spectacles 21 are provided with a receiver 40 of the same remote-control waves RCW.

Specifically, in response to the output signal SL output by the photosensitive sensor 31, representative of the luminosity of the road scene SR in front of the vehicle 20, the circuit 33 generates a control signal SC, depending on the output signal SL. The control signal SC is then transmitted by the emitter 38 of the control circuit 34, via the RCW waves and the receiver 40, to the adaptive spectacles 21.

The transmission coefficient 14 of the lenses 2 of the adaptive spectacles 21 will thus be modulated depending on the control signal SC received, i.e. depending on the luminosity measured by the photosensitive sensor 31.

The device also comprises generating means 36 for generating data to be displayed, which will also possibly be located in the passenger compartment, remotely from the adaptive spectacles 21. The generating means 36 communicate the data to the adaptive spectacles 21.

The communication between the generating means 36 for generating data and the adaptive spectacles 21 is also carried out via wireless communication, for example implementing the same protocol as that employed by the controlling means 30 and the adaptive spectacles 21, optionally with the same emitter 38 and/or the same receiver 40.

Thus, the generating means 36 transmit the data with a given intensity command, determined depending on the transmission coefficient 14 defined by the controlling means 30.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A pair of spectacles equipped with at least one lens and intended to be worn by a user, said spectacles comprising: displaying means emitting light rays to project data into a field of view of said user, and
an anti-glare screen provided with a variable transmission coefficient allowing an intensity of incident light intended to pass through said at least one lens toward said user to be attenuated,
wherein said displaying means and said anti-glare screen are positioned so that some light rays emitted by said displaying means, in order to display said data, strike said anti-glare screen,
wherein said spectacles are configured to adapt said transmission coefficient of said anti-glare screen depending on said intensity of incident light, and
wherein said displaying means is operatively coupled to said anti-glare screen so that said displaying means display said data only when said anti-glare screen transmits light.

2. The spectacles as claimed in claim 1, wherein the coupling between the displaying means and the anti-glare screen is produced by controlling the light intensity of said displayed data depending on said transmission coefficient of said anti-glare screen, said light intensity of said displayed data being modified inversely proportionally to said transmission coefficient, in order to create a similar perception of said data by said user regardless of the amount of incident light.

3. The spectacles as claimed in claim 1, wherein said transmission coefficient is determined by pulse width modulation with a set duty cycle.

4. The spectacles as claimed in claim 1, wherein the light intensity of said displayed data is determined by pulse width modulation with a set duty cycle.

5. The spectacles as claimed in claim 3, wherein the light intensity and said transmission coefficient are in phase and have the same duty cycle.

6. The spectacles as claimed in claim 3, wherein said pulse width modulation is carried out with a fixed frequency and with a variable duty cycle.

7. The spectacles as claimed in claim 3, wherein said spectacles comprise means for controlling said duty cycle or duty cycles.

8. The spectacles as claimed in claim 1, wherein said anti-glare screen is in contact with said at least one lens.

9. The spectacles as claimed in claim 1, wherein said anti-glare screen is placed on a second side of said at least one lens, incident light being intended to pass through said at least one lens from the second side of said at least one lens to a first side.

10. The spectacles as claimed in claim 1, wherein said anti-glare screen is equipped with a microelectromechanical layer, which is placed on said at least one lens.

11. The spectacles as claimed in claim 10, wherein said microelectromechanical layer is activatable to block or transmit light.

12. The spectacles as claimed in claim 1, wherein said displaying means comprise a transmitting substrate so as to guide said light rays by internal reflection in said at least one lens.

13. The spectacles as claimed in claim 12, wherein said displaying means comprises a light source able to emit said light rays into said at least one lens.

14. The spectacles as claimed in claim 1, wherein said displaying means comprises an image generator.

15. A device for assisting with driving, especially at night, an automotive vehicle, comprising said spectacles as claimed in claim 1.

16. The spectacles as claimed in claim 3, wherein the light intensity of said displayed data is determined by pulse width modulation with a set duty cycle.

17. The spectacles as claimed in claim 4, wherein said light intensity and said transmission coefficient are in phase and have the same duty cycle.

18. A pair of spectacles equipped with at least one lens and intended to be worn by a user, said spectacles comprising:
- a display emitting light rays to project data into a field of view of said user, and
- an anti-glare screen provided with a variable transmission coefficient allowing an intensity of incident light intended to pass through said at least one lens toward said user to be attenuated,
- wherein said display and said anti-glare screen are positioned so that some of the light rays emitted by said display, in order to display said data, strike said anti-glare screen,
- wherein said spectacles are configured to adapt said transmission coefficient of said anti-glare screen depending on said intensity of incident light, and
- wherein said display is operatively coupled to said anti-glare screen so that said display displays said data only when said anti-glare screen transmits light.

19. The spectacles as claimed in claim 18, wherein the coupling between the display and the anti-glare screen is produced by controlling the light intensity of the displayed data depending on the transmission coefficient of the anti-glare screen, said light intensity of said displayed data being modified inversely proportionally to said transmission coefficient, in order to create a similar perception of said data by the user regardless of the amount of incident light.

20. The spectacles as claimed in claim 18, wherein said transmission coefficient is determined by pulse width modulation with a set duty cycle.

* * * * *